(12) United States Patent
Park et al.

(10) Patent No.: US 7,642,623 B2
(45) Date of Patent: Jan. 5, 2010

(54) FABRICATION METHOD FOR POLYCRYSTALLINE SILICON THIN FILM AND APPARATUS USING THE SAME

(75) Inventors: Ji-Yong Park, Suwon-si (KR); Hye-Hyang Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 34 days.

(21) Appl. No.: 11/949,483

(22) Filed: Dec. 3, 2007

(65) Prior Publication Data

US 2008/0073650 A1 Mar. 27, 2008

Related U.S. Application Data

(62) Division of application No. 10/952,718, filed on Sep. 30, 2004, now Pat. No. 7,326,295.

(30) Foreign Application Priority Data

Oct. 20, 2003 (KR) .................. 10-2003-0073196

(51) Int. Cl.
*H01L 29/02* (2006.01)
(52) U.S. Cl. ................ 257/618; 257/E29.003
(58) Field of Classification Search ............. 257/618, 257/E29.003
See application file for complete search history.

(56) References Cited

U.S. PATENT DOCUMENTS 5,827,773 A * 10/1998 Voutsas .................. 438/488
6,177,391 B1 1/2001 Zafar
6,322,625 B2 11/2001 Im
6,326,286 B1 12/2001 Park et al.
6,555,449 B1 4/2003 Im et al.
6,908,835 B2 6/2005 Sposili et al.
2005/0079736 A1 4/2005 Park et al.

FOREIGN PATENT DOCUMENTS

JP 2003-509844 3/2003
KR 10-2002-0093194 12/2002
WO 97-45827 12/1997

* cited by examiner

*Primary Examiner*—Evan Pert
(74) *Attorney, Agent, or Firm*—H.C. Park & Associates, PLC

(57) ABSTRACT

The present invention relates to a fabrication method for polycrystalline silicon thin film in which amorphous silicon is crystallized by laser using a mask having a mixed structure of laser transmission pattern group and laser non-transmission pattern group, wherein the mask comprises two or more of dot pattern groups in which the non-transmission pattern group is perpendicular to a scan directional axis, and the dot pattern groups are formed in a certain shape and comprise first non-transmission patterns that are not respectively arranged in a row in an axis direction perpendicular to the scan directional axis, and second non-transmission patterns that are formed in the same arrangement as the first non-transmission patterns, but are positioned in such a manner that the second non-transmission patterns are parallel to the first non-transmission patterns and vertical axis of the scan directional axis.

2 Claims, 11 Drawing Sheets

TRANSMISSION REGIONS

OVERLAP

OVERLAP

TRANSMISSION REGIONS

FABRICATION METHOD FOR POLYCRYSTALLINE SILICON THIN FILM AND APPARATUS USING THE SAME

CROSS-REFERENCE TO RELATED APPLICATIONS

This application is a divisional application of U.S. application Ser. No. 10/952,718, filed on Sep. 30, 2004 and claims priority to and the benefit of Korean Patent Application No. 2003-73196, filed on Oct. 20, 2003, both of which are hereby incorporated by reference for all purposes as if fully set forth herein.

BACKGROUND OF THE INVENTION

1. Field of the Invention

The present invention relates to a method for fabricating a polycrystalline silicon thin film for an apparatus and an apparatus that uses polycrystalline silicon thin film fabricated by the method, more particularly, to a method for fabricating a polycrystalline silicon thin film capable of controlling the shape of grains of polycrystalline silicon thin film and an apparatus using the polycrystalline silicon thin film.

2. Discussion of Related Art

Generally, the sequential lateral solidification (SLS) crystallizing method is used to laterally grow grain silicon by irradiating a laser beam on an amorphous silicon layer two or more times. Polycrystalline silicon grains thus fabricated are formed in a columnar shape, and grain boundaries are formed between adjacent grains due to the grains' limited size.

Polycrystalline or single crystal large silicon grains may be formed on a substrate using SLS crystallization technology, and characteristics similar to characteristics of a thin film transistor (TFT) fabricated of single crystal silicon may be obtained.

FIG. 1A, FIG. 1B and FIG. 1C show an ordinary SLS crystallizing method.

In the SLS crystallizing method as illustrated in FIG. 1A, a laser beam is irradiated onto an amorphous silicon thin film layer through a mask having a laser beam transmission region and a laser beam non-transmission region, thereby melting the amorphous silicon in the laser beam transmission region.

Crystallization preferentially occurs at an interface between amorphous silicon and molten silicon if cooling is started after finishing the laser beam irradiation, wherein a temperature gradient is formed in which temperature is gradually decreased in a direction from the interface between amorphous silicon and molten silicon to a molten silicon layer.

Therefore, referring to FIG. 1B, a polycrystalline silicon thin film layer, with laterally grown grains formed in a columnar shape, is formed since heat flux flows in a direction from the interface of the mask to a central part of the molten silicon layer. The polycrystalline silicon grains grow laterally until the molten silicon layer is completely solidified.

As illustrated in FIG. 1C, amorphous silicon and crystalline silicon are melted by moving stage, thereby moving mask, and by irradiating a laser beam onto partially exposed portions of the amorphous silicon thin film layer and already crystallized polycrystalline silicon layer. Silicon atoms are adhered to already formed polycrystalline silicon grains that are covered by the mask so that the length of the grains is increased as the melted amorphous silicon and crystalline silicon cool after being melted.

FIG. 2A, FIG. 2B and FIG. 2C are plan figures that show a method for crystallizing grain silicon using a mask structure of an ordinary fabrication method of polycrystalline silicon thin film, and FIG. 3A, FIG. 3B and FIG. 3C are plan figures of polycrystalline silicon thin films produced in respective stages.

In FIG. 2A, amorphous silicon is melted by irradiating a laser beam onto the amorphous silicon using an ordinary mask with a laser beam transmission region and a laser beam non-transmission region. Polycrystalline silicon is formed as the melted amorphous silicon solidifies.

The mask is shifted as far as a certain distance illustrated in FIG. 2B, and a laser beam is irradiated onto a portion of the previously formed polycrystalline silicon and amorphous silicon as illustrated in FIG. 2C. By continuously scanning the polycrystalline silicon and irradiating a laser beam onto the polycrystalline silicon in this manner, at a part where mask patterns of the amorphous silicon and transmission region overlap with each other, polycrystalline silicon is melted and crystallized as it solidifies.

Polycrystalline silicon crystallinity varies per parts onto which a laser pulse is irradiated due to laser shot energy deviation, or energy density in the laser beam can be uneven in amorphous silicon onto which a laser beam is once irradiated as illustrated in FIG. 3A.

Particularly, laser scan line causes striped defects on upper and lower boundaries between different laser shots as illustrated in FIG. 3B and FIG. 3C.

These striped defects cause luminance non-uniformity on a display device, particularly an organic electroluminescent device.

PCT international patent No. WO 97/45827 and U.S. Pat. No. 6,322,625 disclose technologies for converting amorphous silicon on a substrate into polycrystalline silicon, or for crystallizing only a selected region on the substrate, by the sequential lateral solidification (SLS) method.

Additionally, obtaining TFT characteristics second only to single crystal silicon is disclosed in U.S. Pat. No. 6,177,391, since the barrier effect of grain boundaries for a carrier direction is minimized when an active channel direction is parallel to a direction of grains grown by SLS crystallizing method. But the patent also discloses that large numbers of grain boundaries act as a trap of charge carriers, and TFT characteristics greatly deteriorate when the active channel direction is perpendicular to the grain growing direction.

There is a case, however, where an active matrix display device is fabricated with driving circuit TFTs generally perpendicular to pixel cell region TFTs, wherein uniformity of the display device is improved when an active channel region direction is inclined 30 to 60 degrees to a crystal growing direction.

However, with this method, since the grains are formed by the SLS crystallizing method, the problem of non-uniform grains due to non-uniformity of laser energy density still exists.

Also, with this method, crystallization can not be carried out all over a substrate, therefore an uncrystallized region will always exist, although a method is described in Korean Patent Laid-open Publication No. 2002-93194 in which laser beam patterns are formed in a triangle shape ("◁"), and crystallization is proceeded as moving the triangle shaped ("◁") laser beam patterns widthwise.

SUMMARY OF THE INVENTION

Accordingly, the present invention is directed to a fabrication method for polycrystalline silicon thin film and an apparatus using the same that substantially obviates one or more of the problems due to limitations and disadvantages of the related art.

This invention provides a method for improving uniformity of polycrystalline silicon fabricated when fabricating a polycrystalline silicon thin film by SLS crystallizing method.

This invention also provides a display device using the above fabricated polycrystalline silicon thin film.

Additional features of the invention will be set forth in the description which follows, and in part will be apparent from the description, or may be learned by practice of the invention.

The present invention discloses a method for fabricating polycrystalline silicon thin film in which amorphous silicon is crystallized using a mask having a laser transmission pattern group and a laser non-transmission pattern group. The laser non-transmission pattern group comprises two or more dot pattern groups formed perpendicular to a scan directional axis. The dot pattern groups comprise first non-transmission patterns that are not arranged in a row in an axis direction perpendicular to the scan directional axis, and second non-transmission patterns that are formed in the same arrangement as the first non-transmission patterns, but are positioned in such a manner that the second non-transmission patterns are parallel to an axis perpendicular to the first non-transmission patterns and scan directional axis.

The present invention also discloses an apparatus using polycrystalline silicon thin film fabricated from amorphous silicon by using a mask having a laser transmission pattern group and a laser non-transmission pattern group. The laser non-transmission pattern group comprises two or more dot pattern groups formed perpendicular to a scan directional axis. The dot pattern groups comprise first non-transmission patterns that are not arranged in a line in an axis direction perpendicular to the scan directional axis, and second non-transmission patterns that are formed in the same arrangement as the first non-transmission patterns, but are positioned in such a manner that the second non-transmission patterns are parallel to an axis perpendicular to the first non-transmission patterns and scan directional axis.

The present invention also discloses a mask used for fabricating polycrystalline silicon thin film comprising a laser transmission pattern group and a laser non-transmission pattern group. The laser non-transmission pattern group comprises two or more dot pattern groups formed perpendicular to a scan directional axis. The dot pattern groups comprise first non-transmission patterns that are not arranged in a line in an axis direction perpendicular to the scan directional axis, and second non-transmission patterns that are formed in the same arrangement as the first non-transmission patterns, but are positioned in such a manner that the second non-transmission patterns are parallel to an axis perpendicular to the first non-transmission patterns and scan directional axis.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1A:
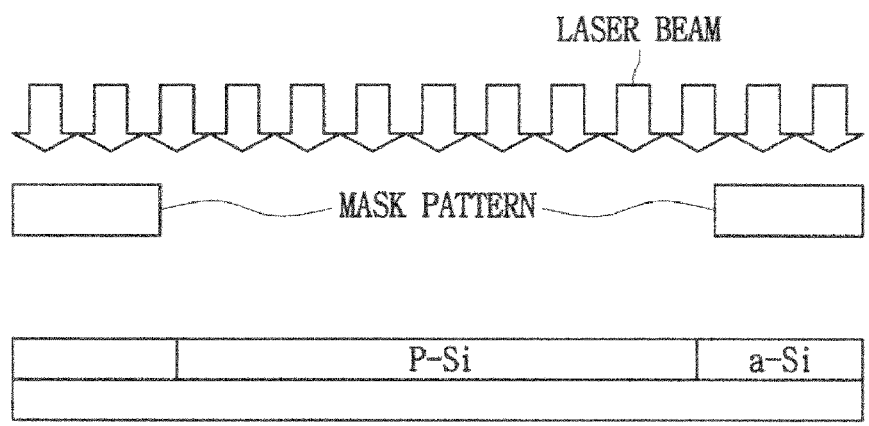
FIG. 1A, FIG. 1B and FIG. 1C show an ordinary sequential lateral solidification (SLS) crystallization method.
Figure 1B:
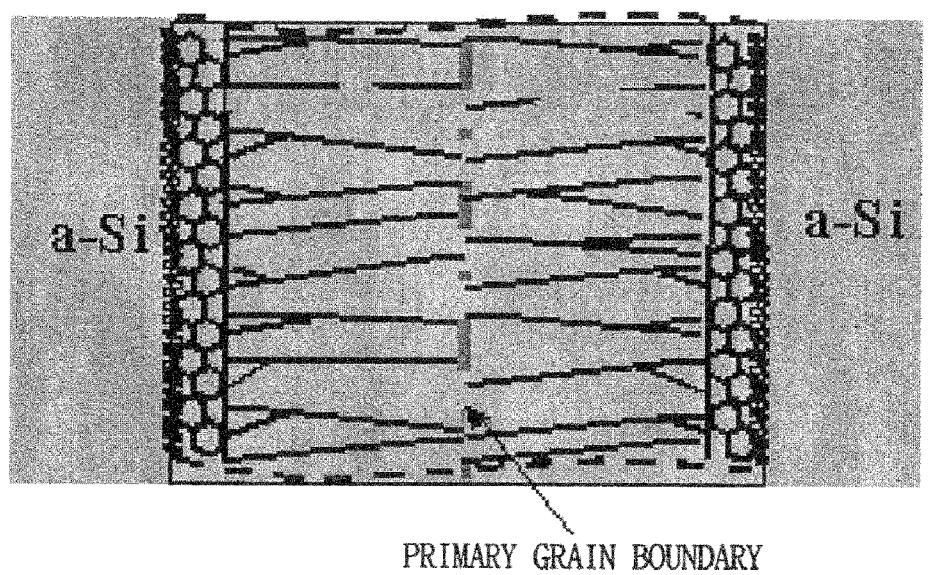
Figure 1C:
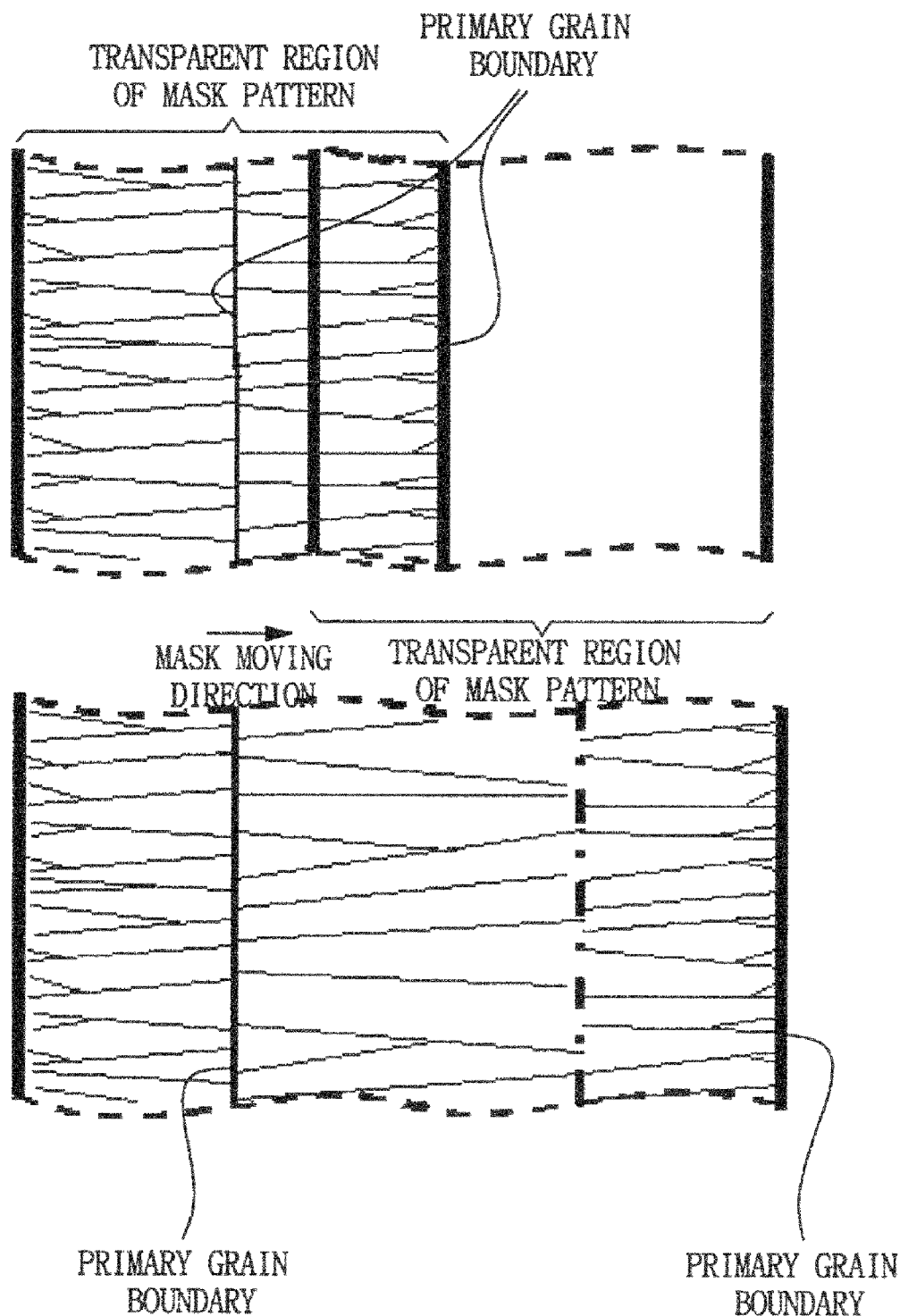
Figure 2A:
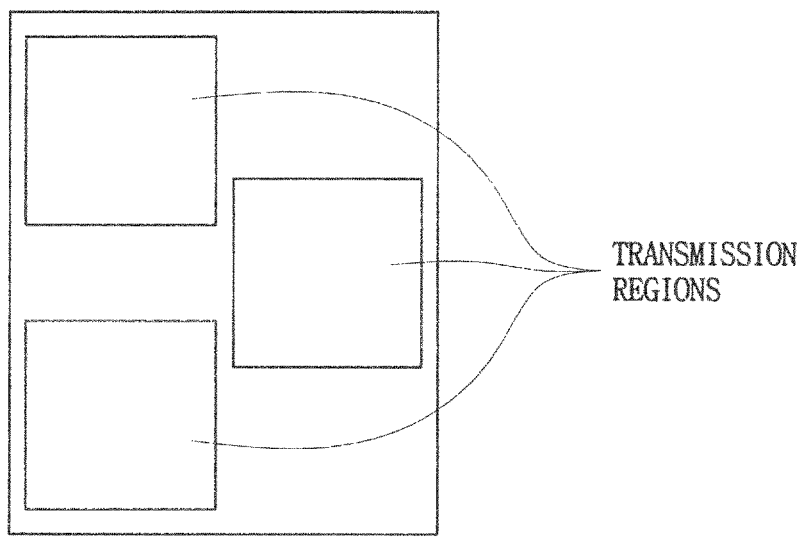
FIG. 2A, FIG. 2B and FIG. 2C are plan figures that show a method for crystallizing grain silicon using a mask structure used in an ordinary fabrication method for polycrystalline silicon thin film.
Figure 2B:
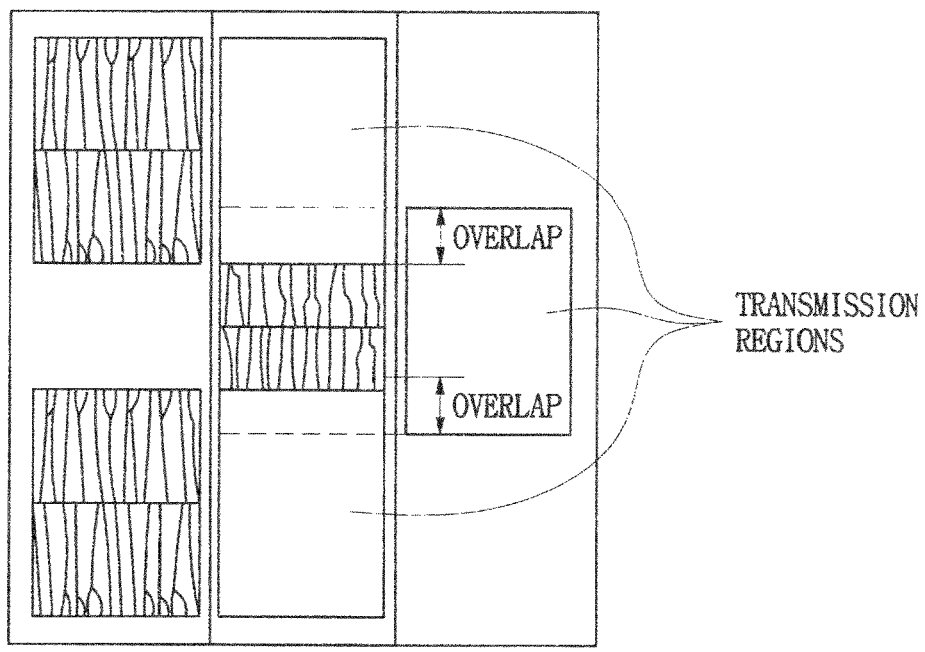
Figure 2C:
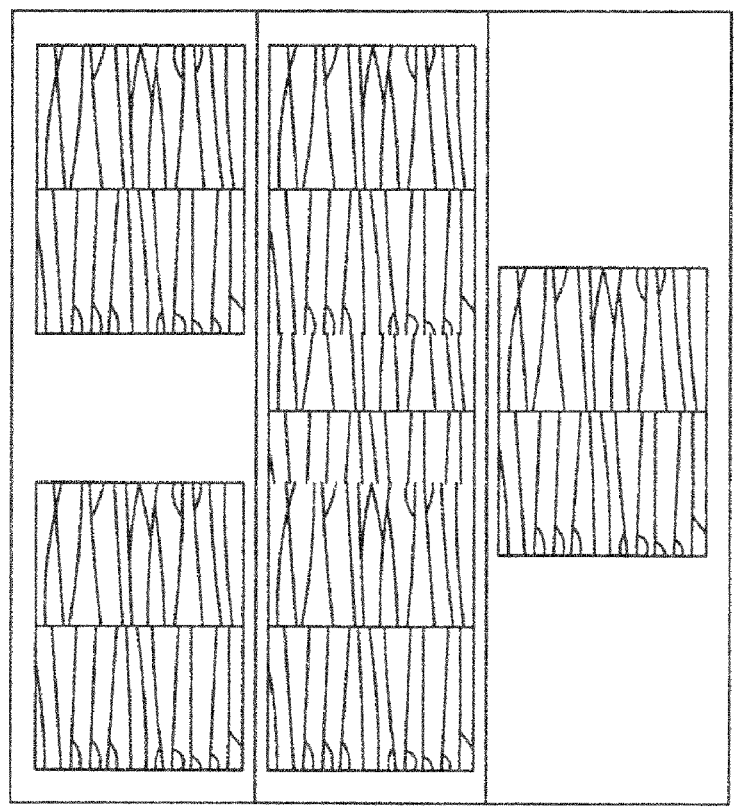
Figure 3A:
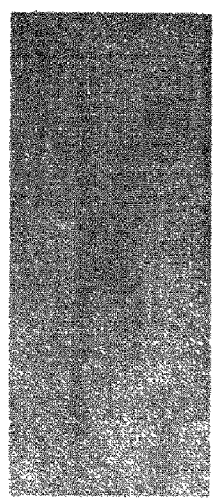
FIG. 3A, FIG. 3B and FIG. 3C are plan figures that show polycrystalline silicon thin film produced in each stage of FIG. 2A, FIG. 2B and FIG. 2C.
Figure 3B:
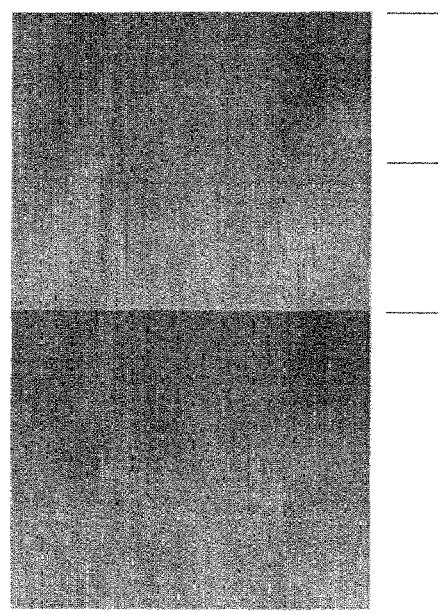
Figure 3C:
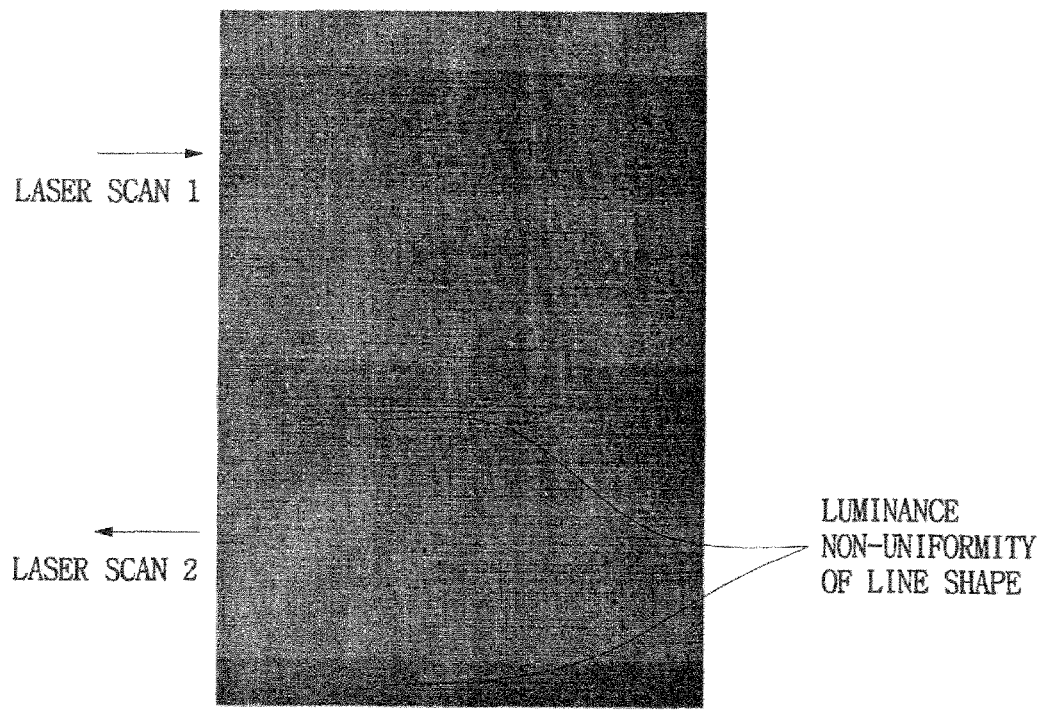

Reference will now be made in detail to an embodiment of the present invention, example of which is illustrated in the accompanying drawings. For reference, like reference characters designate corresponding parts throughout several views.

Figure 4A:
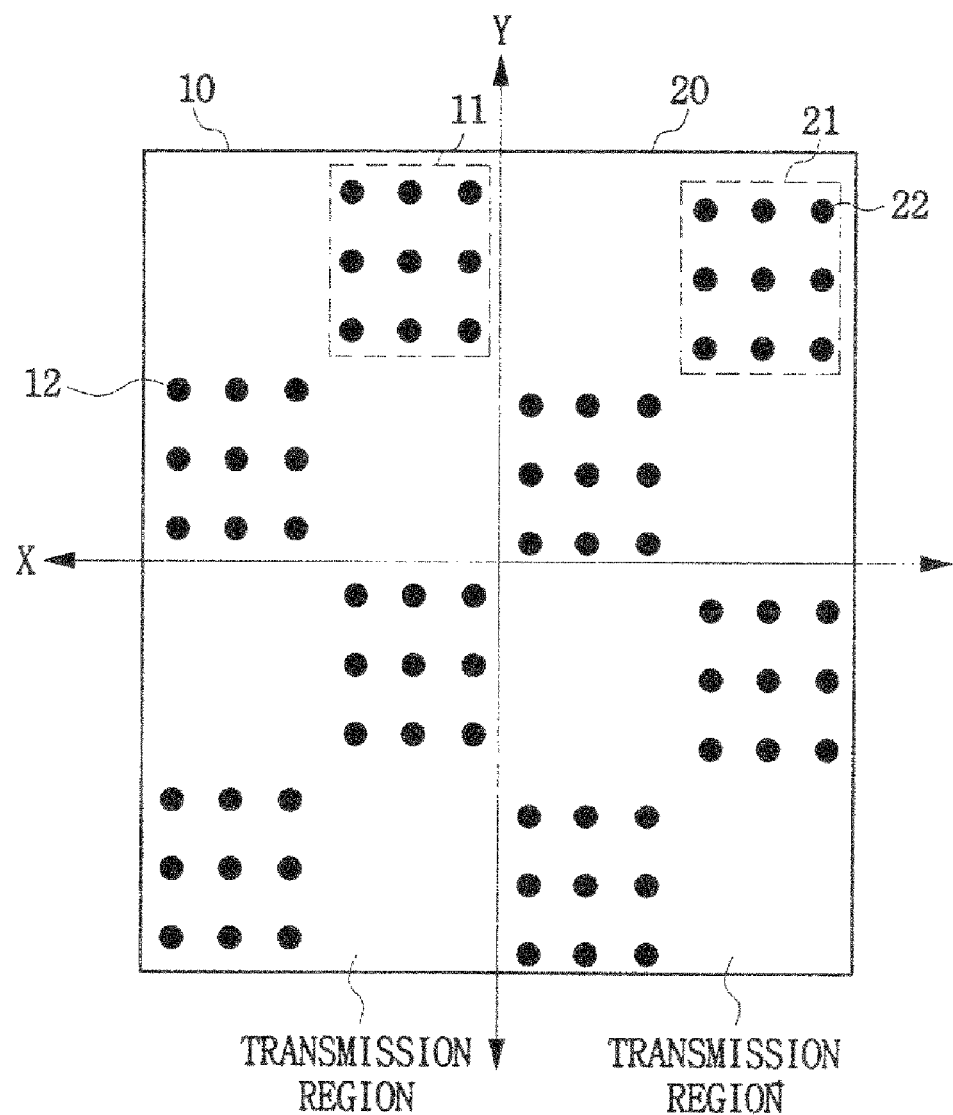
FIG. 4A is a plan figure that shows mask patterns according to a first exemplary embodiment of the present invention.
Figure 4B:
FIG. 4B is a plan figure that shows the position of a dot shaped non-transmission region resulting from the mask of FIG. 4A moving.

FIG. 4A is a plan figure that shows mask patterns according to a first exemplary embodiment of the present invention, and FIG. 4B is a plan figure that shows a dot shaped non-transmission region resulting from the mask of FIG. 4A moving.

Referring to FIG. 4A, first and second non-transmission pattern groups 10, 20 are formed by dot patterns 12, 22 in mask patterns, wherein the non-transmission pattern groups 10, comprise two or more dot pattern groups 11, 21 formed perpendicularly to a scan directional axis, which is an x axis. The first non-transmission pattern group 10 is comprised of dot pattern groups 11 that are formed in a certain shape, and are not arranged in a row in a y axis direction. The second non-transmission pattern group 20 is formed in the same arrangement as the first non-transmission pattern group 10, but is positioned in such a manner that the second non-transmission pattern group 20 is parallel to an axis perpendicular to the first non-transmission patterns and scan directional axis.

The dot pattern groups 11, 21 of the first and second non-transmission pattern groups 10, 20 alternately cross each other in the respective non-transmission pattern groups.

Therefore, dot pattern group 11 of the first non-transmission pattern group 10 and dot pattern group 21 of the second non-transmission pattern group 20 partially overlap when the mask is moved after a single laser irradiation, as illustrated in FIG. 4B. Non-uniformity of crystallinity can not be overcome by crystallizing the melted polycrystalline silicon after melting again polycrystalline silicon having different crystallinity degree according to different energy density of laser, as objected in the present invention, since crystallized polycrystalline silicon is melted and crystallized in the same manner if the two dot pattern groups 11, 21 completely overlap.

Therefore, dot pattern 12 of the first non-transmission pattern group 10 and dot pattern 22 of the second non-transmission pattern group 20 cross each other at a certain distance vertically, in a y axis direction, and the dot pattern group 11 of the first non-transmission pattern group 10 and the dot pattern group 21 of the second non-transmission pattern group 20 partially overlap when the mask is moved as much as half its width.

The dot pattern groups 11, 21 comprising the first non-transmission pattern group 10 and the second non-transmission pattern group 20 are formed in the same quadrilateral shape of nine dots. However, if the shape is quadrilateral, the number of dots included in the dot pattern groups 11, 21 may be changed.

Alternatively, non-transmission patterns of the mask may comprise first and second non-transmission patterns as well as one or more non-transmission patterns having the same shape as the first and second non-transmission patterns in a direction parallel to an axis perpendicular to a scan directional axis.

Figure 5:
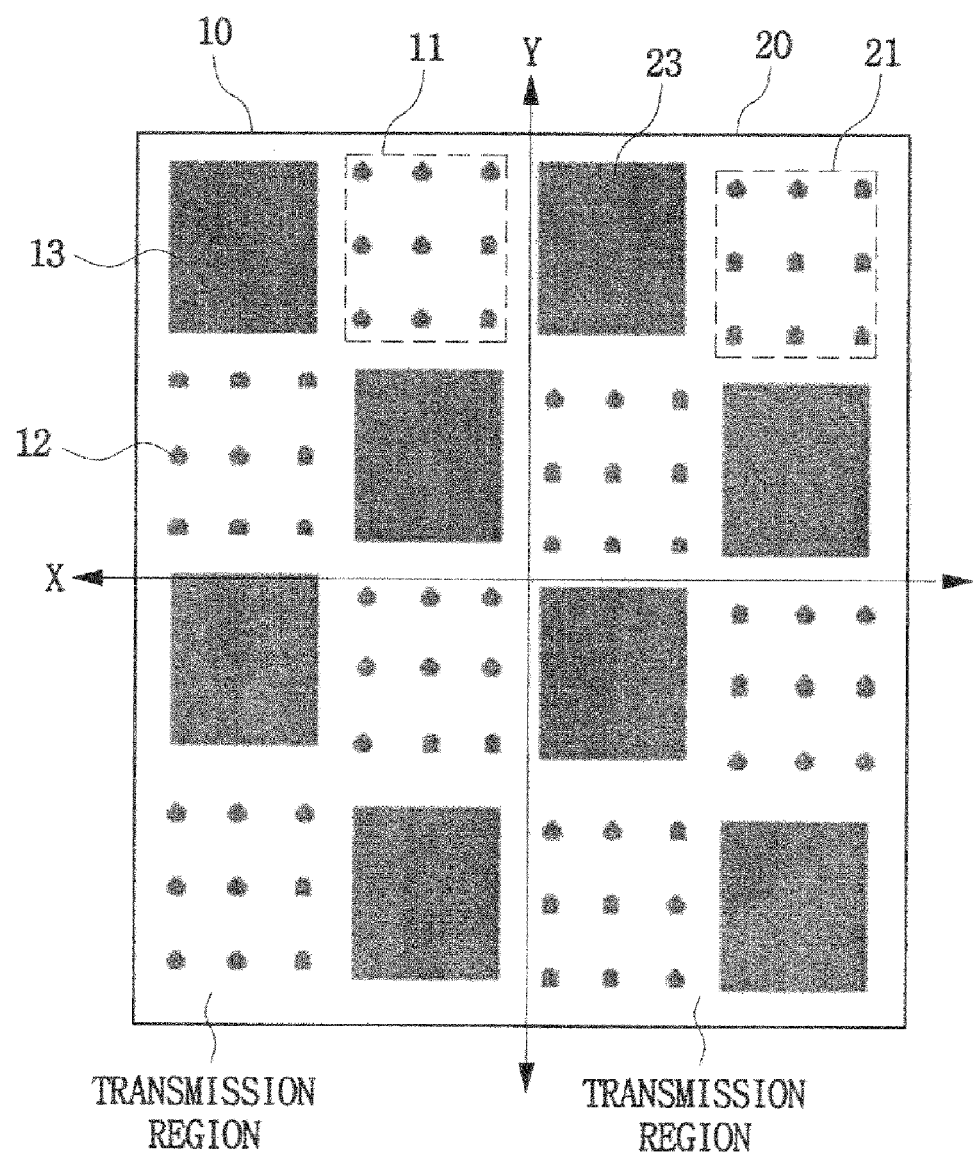
FIG. 5 is a plan figure that shows mask patterns according to a second exemplary embodiment of the present invention.

FIG. 5 is a plan figure that shows mask patterns according to a second exemplary embodiment of the present invention.

Referring to FIG. 5, the first and second non-transmission pattern groups 10, 20 are formed by dot pattern groups 11, 21 and square shaped non-transmission patterns 13, 23, respectively. The square shaped non-transmission patterns 13, 23 are alternately formed between the dot pattern groups 11, 21 in a direction perpendicular to the scan directional axis.

In the second exemplary embodiment, like the first exemplary embodiment, dot pattern group 11 and square shaped non-transmission pattern 13, and dot pattern group 21 and square shaped non-transmission pattern 23, are formed in such a way that they partially overlap when the mask is moved.

Figure 6A:
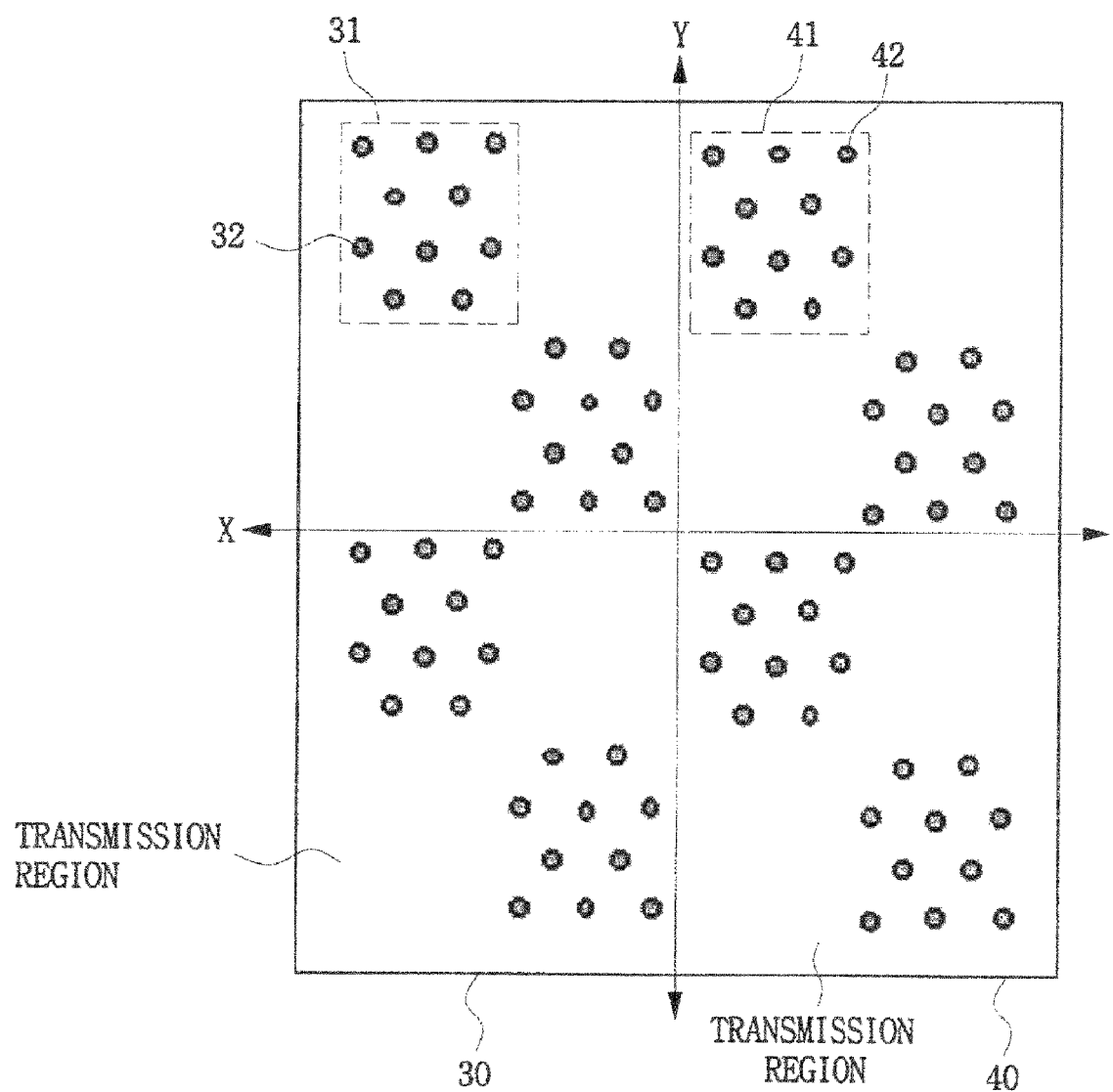
FIG. 6A is a plan figure that shows mask patterns according to a third exemplary embodiment of the present invention.
Figure 6B:
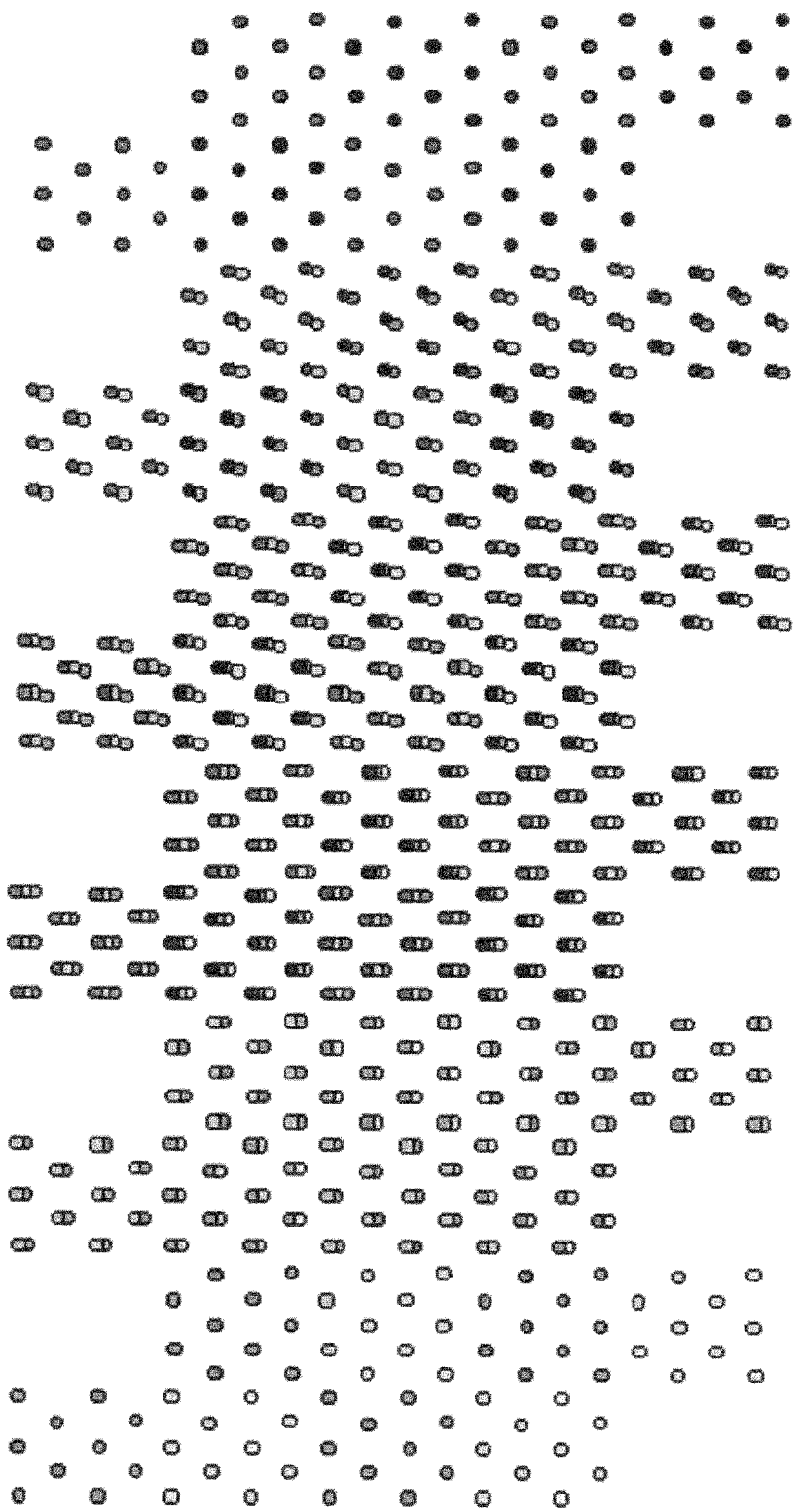
FIG. 6B is a plan figure that shows the position of a dot shaped non-transmission region resulting from the mask of FIG. 6A moving.

FIG. 6A is a plan figure that shows mask patterns according to a third exemplary embodiment of the present invention, and FIG. 6B is a plan figure that shows the position of a dot shaped non-transmission region resulting from the mask of FIG. 6A moving.

The third exemplary embodiment of the present invention is the same as the first exemplary embodiment of the present invention except for the shape of the dot pattern groups and arrangement of dot patterns composing the dot pattern groups.

In the third exemplary embodiment of the present invention, non-transmission dot pattern groups 31, 41 comprise different numbers of dot patterns 32, 42 alternately formed in a y axis direction.

That is, referring to FIG. 6A, odd numbered lines of the dot pattern groups 31, 41 are formed of n dots or n−1 dots, and even numbered lines of the dot pattern groups 31, 41 are formed of n−1 dots or n dots.

Preferably, n is 3 or more, and adjacent dot pattern groups 31, 41 in the first non-transmission pattern 30 and second non-transmission pattern 40, respectively, are diagonally symmetrical to each other.

In this construction, dot pattern group 31 of the first non-transmission pattern 30 and dot pattern group 41 of the second non-transmission pattern 40 partially overlap when the mask is moved after a single laser irradiation, as illustrated in FIG. 6B. Non-uniformity of crystallinity can not be overcome by crystallizing the melted polycrystalline silicon after melting again polycrystalline silicon having different crystallinity degree according to different energy density of laser as objected in the present invention since crystallized polycrystalline silicon is melted and crystallized in the same manner if the two dot pattern groups 31, 41 completely overlap.

Therefore, dot pattern 32 of the first non-transmission pattern 30 and dot pattern 42 of the second non-transmission pattern 40 cross each other at a certain distance vertically, in a y axis direction, and the dot pattern group 31 of the first non-transmission pattern 30 and the dot pattern group 41 of the second non-transmission pattern 40 partially overlap when the mask is moved as much as half its width.

Alternatively, non-transmission patterns 30, 40 of the mask may comprise first and second non-transmission patterns as well as one or more non-transmission patterns having the same shape as the first and second non-transmission patterns in a direction parallel to an axis perpendicular to a scan directional axis.

Figure 7:
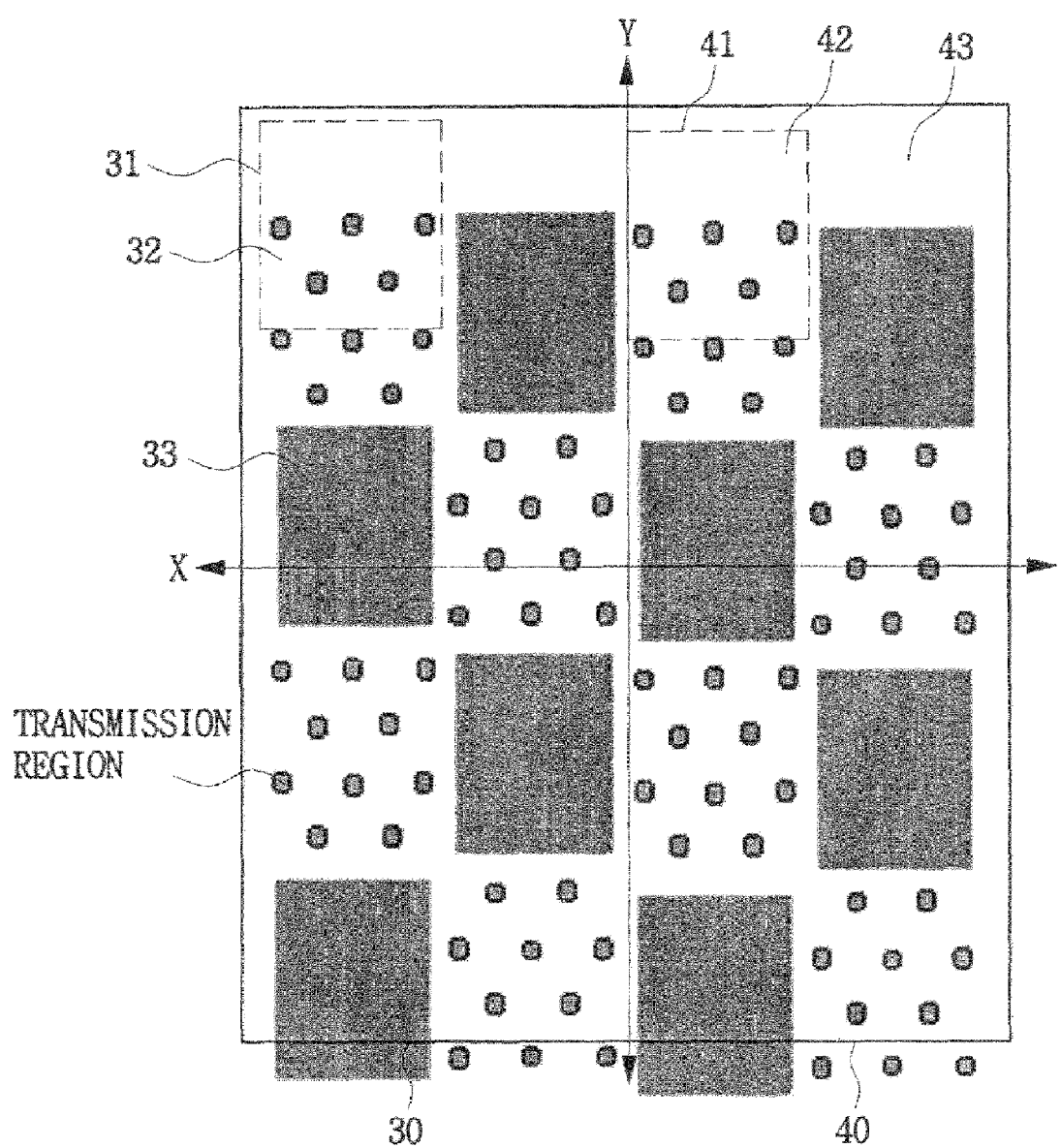
FIG. 7 is a plan figure that shows mask patterns according to a fourth exemplary embodiment of the present invention.

FIG. 7 is a plan figure that shows mask patterns according to a fourth exemplary embodiment of the present invention.

Referring to FIG. 7, the first and second non-transmission patterns 30, 40 are formed by dot pattern groups 31, 41 and square shaped non-transmission patterns 33, 43, respectively. The square shaped non-transmission patterns are alternately formed between the dot pattern groups in a direction perpendicular to the scan directional axis.

Also, in the fourth exemplary embodiment, dot pattern groups 31 and square shaped non-transmission patterns 33, and dot pattern groups 41 and square shaped non-transmission patterns 43 are formed in such a way that they partially overlap when the mask is moved.

As described above, non-uniform crystallization of polycrystalline silicon due to non-uniformity of laser energy density may be prevented by mask pattern designs.

A display device used in the present invention is preferably a flat panel display device such as liquid crystal display device or organic electroluminescent device.

As described above, the present invention may be capable of solving luminance non-uniformity on a display device by forming mask transmission regions so that non-uniformity of crystallization of polycrystalline silicon according to laser deviation is overcome.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    a polycrystalline silicon thin film, wherein the polycrystalline silicon thin film comprises regions of polycrystalline silicon separated by overlapping dot-shaped regions of amorphous silicon, and is fabricated by process of:
    using a mask having a laser transmission pattern group and a laser non-transmission pattern group; and
    moving the mask, after laser irradiation, a certain distance, wherein the laser non-transmission pattern group comprises two or more dot pattern groups formed perpendicular to a scan directional axis, and
    wherein the dot pattern groups comprise:
        first non-transmission patterns that are not arranged in a line in an axis direction perpendicular to the scan directional axis, and
        second non-transmission patterns that are formed in a same arrangement as the first non-transmission patterns, but are positioned so that the second non-transmission patterns are parallel to an axis perpendicular to the first non-transmission patterns and the scan directional axis.

2. The display device according to claim 1, wherein the display device is an organic electroluminescent device or a liquid crystal display device.

* * * * *